(12) United States Patent
Kagan

(10) Patent No.: US 8,022,690 B2
(45) Date of Patent: *Sep. 20, 2011

(54) INTELLIGENT ELECTRONIC DEVICE FOR PROVIDING BROADBAND INTERNET ACCESS

(75) Inventor: Erran Kagan, Great Neck, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/493,314

(22) Filed: Jun. 29, 2009

(65) Prior Publication Data

US 2009/0265124 A1    Oct. 22, 2009

Related U.S. Application Data

(63) Continuation of application No. 11/589,379, filed on Oct. 30, 2006, now Pat. No. 7,554,320.

(60) Provisional application No. 60/731,007, filed on Oct. 28, 2005.

(51) Int. Cl.
*G01R 11/32* (2006.01)
*G01R 21/00* (2006.01)

(52) U.S. Cl. .......................... 324/142; 702/62

(58) Field of Classification Search ............. 324/142, 324/140 R, 76.11, 156, 157; 702/57, 60, 702/61, 62; 340/870.01, 870.02
See application file for complete search history.

(56) References Cited

U.S. PATENT DOCUMENTS

| 5,459,459 A | 10/1995 | Lee, Jr. |
| 5,572,438 A | 11/1996 | Ehlers et al. |
| 5,627,759 A | 5/1997 | Bearden et al. |
| 5,650,936 A | 7/1997 | Loucks et al. |
| 5,736,847 A | 4/1998 | Van Doorn et al. |
| 5,828,576 A | 10/1998 | Loucks et al. |
| 5,862,391 A | 1/1999 | Salas et al. |
| 5,897,607 A | 4/1999 | Jenney et al. |
| 5,995,911 A | 11/1999 | Hart |
| 6,000,034 A | 12/1999 | Lightbody et al. |
| D427,533 S | 7/2000 | Cowan et al. |
| D429,655 S | 8/2000 | Cowan et al. |
| D435,471 S | 12/2000 | Simbeck et al. |

(Continued)

OTHER PUBLICATIONS

Xu Hong, Wang Jianhua, "An Extendable Data Engine based on OPC Specification", Computer Standards & Interfaces 26 (2004) 515-525; Dec. 5, 2003.

(Continued)

*Primary Examiner* — Hoai-An D Nguyen
(74) *Attorney, Agent, or Firm* — Gerald E. Hespos; Michael J. Porco

(57) ABSTRACT

An intelligent electronic device for monitoring and determining an amount of electrical power usage by a consumer, or end user, and for providing broadband Internet access to the consumer. The intelligent electronic device includes at least one sensor coupled to an electric circuit configured for measuring at least one power parameter of the electrical circuit and generating at least one analog signal indicative of the at least one power parameter; at least one digital to analog converter coupled to the at least one sensor configured for receiving the at least one analog signal and converting the at least one analog signal to at least one digital signal; a processor configured for receiving the at least one digital signal and calculating energy consumption in the electrical circuit; and a gateway configured for receiving data transmissions imposed on the electrical circuit and for demodulating the imposed data transmission for providing data communications.

43 Claims, 3 Drawing Sheets

U.S. PATENT DOCUMENTS

| | | | |
|---|---|---|---|
| 6,185,508 B1 | 2/2001 | Van Doorn et al. | |
| 6,186,842 B1 | 2/2001 | Hirschbold et al. | |
| D439,535 S | 3/2001 | Cowan et al. | |
| 6,236,949 B1 | 5/2001 | Hart | |
| D443,541 S | 6/2001 | Hancock et al. | |
| 6,301,527 B1 | 10/2001 | Butland et al. | |
| 6,363,057 B1 | 3/2002 | Ardalan et al. | |
| 6,396,839 B1 | 5/2002 | Ardalan et al. | |
| 6,397,155 B1 | 5/2002 | Przydatek et al. | |
| D458,863 S | 6/2002 | Harding et al. | |
| D459,259 S | 6/2002 | Harding et al. | |
| 6,493,644 B1 | 12/2002 | Jonker et al. | |
| 6,553,418 B1 | 4/2003 | Collins et al. | |
| 6,563,697 B1 | 5/2003 | Simback et al. | |
| 6,611,773 B2 | 8/2003 | Przydatek et al. | |
| 6,611,922 B2 | 8/2003 | Ozcetin et al. | |
| 6,615,147 B1 | 9/2003 | Jonker et al. | |
| 6,636,030 B1 | 10/2003 | Rose et al. | |
| 6,671,635 B1 | 12/2003 | Forth et al. | |
| 6,671,654 B1 | 12/2003 | Forth et al. | |
| 6,687,627 B1 | 2/2004 | Gunn et al. | |
| 6,694,270 B2 | 2/2004 | Hart | |
| 6,735,535 B1 | 5/2004 | Kagan et al. | |
| 6,737,855 B2 | 5/2004 | Huber et al. | |
| 6,745,138 B2 | 6/2004 | Przydatek et al. | |
| 6,751,562 B1 | 6/2004 | Blackett et al. | |
| 6,751,563 B2 | 6/2004 | Spanier et al. | |
| 6,792,337 B2 | 9/2004 | Blackett et al. | |
| 6,792,364 B2 | 9/2004 | Jonker et al. | |
| 6,798,190 B2 | 9/2004 | Harding et al. | |
| 6,798,191 B1 | 9/2004 | Macfarlane et al. | |
| 6,813,571 B2 | 11/2004 | Lightbody et al. | |
| 6,825,776 B2 | 11/2004 | Lightbody et al. | |
| 6,853,978 B2 | 2/2005 | Forth et al. | |
| 6,867,707 B1 | 3/2005 | Kelley et al. | |
| 6,871,150 B2 | 3/2005 | Huber et al. | |
| D505,087 S | 5/2005 | Ricci et al. | |
| 6,894,979 B1 | 5/2005 | Lee | |
| 6,944,555 B2 | 9/2005 | Blackett et al. | |
| 6,957,158 B1 | 10/2005 | Hancock et al. | |
| 6,961,641 B1 | 11/2005 | Forth et al. | |
| 6,983,211 B2 | 1/2006 | Macfarlene et al. | |
| 6,988,025 B2 | 1/2006 | Ransom et al. | |
| 6,988,182 B2 | 1/2006 | Teachman et al. | |
| 6,990,395 B2 | 1/2006 | Ransom et al. | |
| 7,006,934 B2 | 2/2006 | Jonker et al. | |
| 7,010,438 B2 | 3/2006 | Hancock et al. | |
| 7,019,639 B2 * | 3/2006 | Stilp | 340/531 |
| 7,047,216 B2 | 5/2006 | Kashti | |
| 7,058,524 B2 | 6/2006 | Hayes et al. | |
| 7,072,779 B2 | 7/2006 | Hancock et al. | |
| 7,085,824 B2 | 8/2006 | Forth et al. | |
| 7,089,089 B2 | 8/2006 | Cumming et al. | |
| 7,127,328 B2 | 10/2006 | Ransom | |
| D532,747 S | 11/2006 | Ricci et al. | |
| 7,136,384 B1 | 11/2006 | Wang | |
| D534,120 S | 12/2006 | Ricci et al. | |
| 7,155,350 B2 | 12/2006 | Kagan | |
| 7,158,050 B2 | 1/2007 | Lightbody et al. | |
| 7,174,258 B2 | 2/2007 | Hart | |
| 7,174,261 B2 | 2/2007 | Gunn et al. | |
| 7,184,904 B2 | 2/2007 | Kagan | |
| 7,188,003 B2 | 3/2007 | Ransom et al. | |
| 7,191,076 B2 | 3/2007 | Huber et al. | |
| 7,216,043 B2 | 5/2007 | Ransom et al. | |
| 7,246,014 B2 | 7/2007 | Forth et al. | |
| 7,248,977 B2 | 7/2007 | Hart | |
| 7,248,978 B2 | 7/2007 | Ransom | |
| 7,249,265 B2 | 7/2007 | von Carolsfeld et al. | |
| 7,256,709 B2 | 8/2007 | Kagan | |
| 7,271,996 B2 | 9/2007 | Kagan | |
| 7,294,997 B2 | 11/2007 | Kagan | |
| 7,304,586 B2 | 12/2007 | Wang et al. | |
| 7,305,310 B2 | 12/2007 | Slota et al. | |
| 7,312,721 B2 | 12/2007 | Mason et al. | |
| 7,337,081 B1 | 2/2008 | Kagan | |
| 7,379,997 B2 | 5/2008 | Ehlers et al. | |
| 7,415,368 B2 | 8/2008 | Gilbert et al. | |
| 7,424,024 B2 * | 9/2008 | Chen et al. | 370/401 |
| 7,447,760 B2 | 11/2008 | Forth et al. | |
| 7,447,762 B2 | 11/2008 | Curray et al. | |
| 7,542,721 B1 * | 6/2009 | Bonner et al. | 455/41.2 |
| 7,554,320 B2 * | 6/2009 | Kagan | 324/142 |
| 7,720,486 B2 * | 5/2010 | Ross et al. | 455/456.1 |
| 7,734,380 B2 * | 6/2010 | Ransom et al. | 700/286 |
| 2002/0091784 A1 | 7/2002 | Baker et al. | |
| 2002/0114326 A1 | 8/2002 | Mahalingaiah | |
| 2002/0120723 A1 | 8/2002 | Forth et al. | |
| 2002/0162014 A1 | 10/2002 | Przydatek et al. | |
| 2002/0165677 A1 | 11/2002 | Lightbody et al. | |
| 2003/0009401 A1 | 1/2003 | Ellis | |
| 2003/0014200 A1 | 1/2003 | Jonker et al. | |
| 2003/0065459 A1 | 4/2003 | Huber et al. | |
| 2003/0084112 A1 | 5/2003 | Curray et al. | |
| 2003/0101008 A1 | 5/2003 | Hart | |
| 2003/0105608 A1 | 6/2003 | Hart | |
| 2003/0132742 A1 | 7/2003 | Harding et al. | |
| 2003/0154471 A1 | 8/2003 | Teachman et al. | |
| 2003/0176952 A1 | 9/2003 | Collins et al. | |
| 2003/0210699 A1 | 11/2003 | Holt, Sr. et al. | |
| 2003/0212512 A1 | 11/2003 | Hart | |
| 2003/0220752 A1 | 11/2003 | Hart | |
| 2004/0066311 A1 | 4/2004 | Giles et al. | |
| 2004/0113810 A1 | 6/2004 | Mason et al. | |
| 2004/0138786 A1 | 7/2004 | Blackett et al. | |
| 2004/0138787 A1 | 7/2004 | Ransom et al. | |
| 2004/0138835 A1 | 7/2004 | Ransom et al. | |
| 2004/0172207 A1 | 9/2004 | Hancock et al. | |
| 2004/0183522 A1 | 9/2004 | Gunn et al. | |
| 2004/0229578 A1 | 11/2004 | Lightbody et al. | |
| 2004/0254750 A1 | 12/2004 | Macfarlene et al. | |
| 2005/0017874 A1 | 1/2005 | Lightbody et al. | |
| 2005/0027464 A1 | 2/2005 | Jonker et al. | |
| 2005/0071106 A1 | 3/2005 | Huber et al. | |
| 2005/0275397 A1 | 12/2005 | Lightbody et al. | |
| 2005/0288876 A1 | 12/2005 | Doig et al. | |
| 2005/0288877 A1 | 12/2005 | Doig et al. | |
| 2006/0015271 A1 | 1/2006 | Cowan et al. | |
| 2006/0038672 A1 | 2/2006 | Schoettle | |
| 2006/0052958 A1 | 3/2006 | Hancock et al. | |
| 2006/0071813 A1 | 4/2006 | Kagan | |
| 2006/0077999 A1 | 4/2006 | Kagan et al. | |
| 2006/0086893 A1 | 4/2006 | Spanier et al. | |
| 2006/0161400 A1 | 7/2006 | Kagan | |
| 2006/0170409 A1 | 8/2006 | Kagan et al. | |
| 2006/0187956 A1 | 8/2006 | Doviak et al. | |
| 2006/0230394 A1 | 10/2006 | Forth et al. | |
| 2006/0271244 A1 | 11/2006 | Cumming et al. | |
| 2006/0271314 A1 | 11/2006 | Hayes | |
| 2007/0067121 A1 | 3/2007 | Przydatek et al. | |
| 2007/0067199 A1 | 3/2007 | Shine et al. | |
| 2007/0114987 A1 | 5/2007 | Kagan | |
| 2007/0136010 A1 | 6/2007 | Gunn et al. | |
| 2007/0189182 A1 | 8/2007 | Berkman et al. | |
| 2008/0046205 A1 | 2/2008 | Gilbert et al. | |
| 2008/0065335 A1 | 3/2008 | Doig et al. | |

OTHER PUBLICATIONS

Multi-port Communications Card (MPCC), Multi-port Ethernet Communications Card (MPE), Installation & Configuration Instructions, Power Measurement, pp. 1-9, rev. date Jul. 25, 1997.

Engage Network, Inc., "Internet Protocol Card for Revenue Meters", http://www.engagenet.com. Link present as of Mar. 2000 on http://web.archive.org/web/20010306005433/www.engagenet.com/content/products.shtml.

"Webgate Iris (Internet Residential Information System )"; http://www.munet.com/munetproducts.irisindex.html "Products," pp. 1-3; http://www.munet.com/munetproductsiris.html "Preliminary Specification" pp. 1-2; http://www.munet.com/munetproductsiris_Spec.html, May 24, 2001.

"Webgate Icis (Internet Commercial Information System)", pp. 1 at http://www.munet.com/munetproductsicisindex.htm, "Products (WebGate ICIS Internet AMR now)," pp. 1-2 at http://www.munet.com/munetproductsicis.htm, Products (Webgate ICIS Control Cenetr Software), pp. 1-2 at http://222.munet.com/munetproductsicisSpec.htm, May 24, 2001.

"muNet Demonstrates End-toEnd IP-Based Energy Management System at DistribuTECH," pp. 1-2 at http://www.munet.com/muNetNewPressReleases_0205001.htm, May 24, 2001.

"muNet's WebGate IRIS Deployed for Utility Trials Across US", pp. 1-2 at http://www.munet.com/muNetNewPressReleases121300.htm.

"muNet's WebGate System Finds a Home on the Internet," pp. 1-2 at http://www.munet.com/muNetNewPressReleases031899.htm.

* cited by examiner

INTELLIGENT ELECTRONIC DEVICE FOR PROVIDING BROADBAND INTERNET ACCESS

The present application is a continuation application of U.S. application Ser. No. 11/589,379, filed Oct. 30, 2006, now U.S. Pat. No. 7,554,320, entitled "Intelligent Electronic Device for Providing Broadband Internet Access", which claims priority on U.S. Provisional Patent Application. No. 60/731,007, filed Oct. 28, 2005.

BACKGROUND OF THE INVENTION

1. Field of the Invention

The present disclosure relates generally to intelligent electronic devices for electrical power systems, and more particularly, to an intelligent electronic device for monitoring and determining an amount of electrical power usage by a consumer, or end user, and for providing broadband Internet access to the consumer.

2. Description of the Related Art

Electric utility companies ("utilities") track electric usage by customers by using power meters. These meters track the amount of power consumed at a particular location. These locations range from power substations, to commercial businesses, to residential homes. The electric utility companies use information obtained from the power meter to charge its customers for their power consumption, i.e. revenue metering.

A popular type of power meter is the socket-type power meter, i.e., S-base or Type S meter. As its name implies, the meter itself plugs into a socket for easy installation, removal and replacement. This type of meter is used to measure energy usage and KW demand at the site of an electric utility customer. The meter is installed at the point of common coupling from the electrical utility tie and the incoming main for the electric utility customer. These meters commonly include features such as load profiling, time of use calculations, voltage measurements, current measurements and a method of testing the meters accuracy and conformity. Additionally, these meters include meter seals and anti-tampering mechanisms that insure that the utility customer does not interfere with the accurate measurements of the meter.

Traditionally, electric utilities employed meter readers to visit each of the meter locations to manually, or with a handheld reader, read the meter. This was proven to be costly due to the fact that it required a plethora of technically trained readers that were required to walk from house to house or to each facility to read the meters. Newer type systems incorporate a low power signal that allows meter readers to read said meters using a automobile driving slowing down a street in which a bank of meters are installed. This too has been proven to be costly because it still involves meter reading personnel needing to visit the physical location. In an attempt to rectify this problem, different communication methods were attempted including land-line telephone (often using the customer's existing telephone line) and cellular data communication. Unfortunately, these technologies are subject to technical difficulties. They provide very slow communication, are generally not very reliable and often telephone land service or cell reception are unavailable.

Other meter installations include panel mounted, switchboard mounted, and circuit breaker mounted. Typically the power meter connects between utility power lines supplying electricity and a usage point, namely a residence or commercial place of business. Though not typical, a power meter may also be placed at a point within the utility's power grid to monitor power flowing through that point for distribution, power loss, or capacity monitoring. Also, power meters can be used to monitor internal customer usage, that is, handle sub-metering functions.

In today's times, electric utility companies are looking to expand the services they provide to customer so that they can generate additional revenue. Similarly, cable and telephone companies have expended their services by providing voice over IP (VoIP) and high speed Internet access. The cable and telephone companies have been able to provide these services utilizing some existing equipment, e.g., cable lines and telephone lines entering the customer location. However, additional hardware and wiring is required in most cases to extend access points to the location of the user's equipment, e.g., a computer.

Therefore, a need exists for devices, systems and methods for delivering broadband access to end users via conventional electrical distribution lines without requiring the installation of new wires or significant changes to the existing infrastructure.

SUMMARY OF THE INVENTION

An intelligent electronic device, e.g., an electrical power meter, for monitoring and determining an amount of electrical power usage by a consumer and for providing broadband Internet access to the consumer is provided. The electrical power meter is installed on the customer's front as both a router gateway providing either wireless Ethernet or power line carrier (PLC) through the existing power lines and an additional power line carrier Ethernet gateway to the customer's home. This will allow the customer to plug (via an adapter) both telephone and computers into the existing power line directly and get high speed Internet access.

Advantageously, the power meter becomes the gateway so that no additional components are needed and no professional installation is required. For example, in one embodiment, every existing power outlet in the customer's location will provide Internet access by simply plugging an adapter into the power outlet and connecting the adapter to a computer, printer, VoIP-enabled phone, etc. via a USB, Ethernet, etc. interface. In another embodiment, the power meter will provide wireless access via any known wireless protocol to any device including a wireless card either external or internal. Furthermore, the IED or electrical power meter gets power from the voltage it is measuring.

According to one aspect of the present disclosure, an intelligent electronic device for providing broadband access to a network is provided. The intelligent electronic device includes at least one sensor coupled to an electric circuit configured for measuring at least one power parameter of the electrical circuit and generating at least one analog signal indicative of the at least one power parameter; at least one digital to analog converter coupled to the at least one sensor configured for receiving the at least one analog signal and converting the at least one analog signal to at least one digital signal; a processor configured for receiving the at least one digital signal and calculating energy consumption in the electrical circuit; and a gateway configured for receiving data transmissions imposed on the electrical circuit and for demodulating the imposed data transmission for providing data communications.

According to another aspect, a socket based revenue meter for providing broadband access to a network includes bayonet terminals disposed on the meter mateable with matching jaws of a detachable meter mounting device; at least one sensor coupled to an electric circuit configured for measuring at least one power parameter of the electrical circuit and generating at least one analog signal indicative of the at least one power parameter; at least one digital to analog converter coupled to the at least one sensor configured for receiving the at least one analog signal and converting the at least one analog signal to at least one digital signal; a processor configured for receiving the at least one digital signal and calculating energy consumption in the electrical circuit; and a gateway configured for receiving data transmissions imposed on the electrical circuit and for demodulating the imposed data transmission for providing data communications.

The above and other aspects, features, and advantages of the present disclosure will become more apparent in light of the following detailed description when taken in conjunction with the accompanying drawings.

DETAILED DESCRIPTION OF THE PREFERRED EMBODIMENTS

Figure 1:
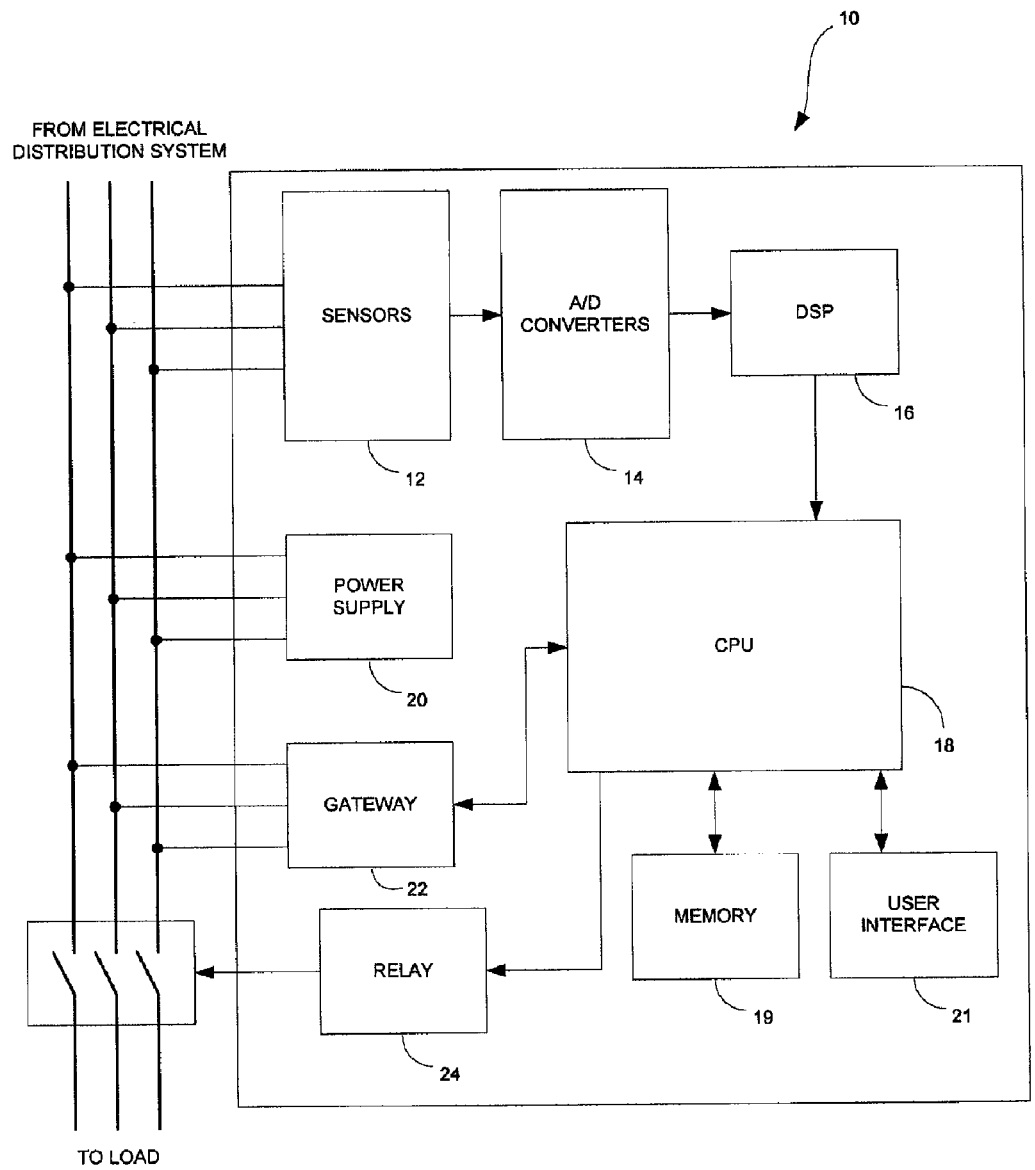
FIG. 1 is a diagram of an intelligent electronic device in accordance with an embodiment of the present disclosure.

Preferred embodiments of the present disclosure will be described herein below with reference to the accompanying drawings. In the following description, well-known functions or constructions are not described in detail to avoid obscuring the present disclosure in unnecessary detail.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering. Exemplary intelligent electronic devices are disclosed and described in the following commonly owned U.S. issued patents and published applications: U.S. patent application Ser. No. 10/146,339 entitled "METER WITH IRDA PORT" filed on May 15, 2002; U.S. patent application Ser. No. 10/958,456 entitled "METER HAVING A COMMUNICATION INTERFACE FOR RECEIVING AND INTERFACING WITH A COMMUNICATION DEVICE" filed on Oct. 5, 2004; U.S. patent application Ser. No. 11/087,438 entitled "SYSTEM AND METHOD FOR SIMULTANEOUS COMMUNICATION ON MODBUS AND DNP 3.0 OVER ETHERNET FOR ELECTRONIC POWER METER" filed on Mar. 23, 2005; U.S. patent application Ser. No. 11/109,351 entitled 'SYSTEM AND METHOD FOR COMPENSATING FOR POTENTIAL AND CURRENT TRANSFORMERS IN ENERGY METERS" filed on Apr. 18, 2005; U.S. patent application Ser. No. 11/039,316 entitled "MULTIPLE ETHERNET PORTS ON POWER METER" filed on Jan. 19, 2005; U.S. patent application Ser. No. 11/003,064 entitled "CURRENT INPUTS INTERFACE FOR AN ELECTRICAL DEVICE" filed on Dec. 3, 2004; U.S. patent application Ser. No. 11/042,588 entitled "SYSTEM AND METHOD FOR CONNECTING ELECTRICAL DEVICES USING FIBER OPTIC SERIAL COMMUNICATION" filed on Jan. 24, 2005; U.S. Design Pat. No. D525,893 entitled "ELECTRONIC POWER METER" issued on Aug. 1, 2006; U.S. patent application Ser. No. 11/091,254 entitled "SYSTEM AND METHOD FOR PROVIDING UNIVERSAL ADDITIONAL FUNCTIONALITY FOR POWER METERS" filed on Mar. 28, 2005; U.S. patent application Ser. No. 11/341,802 entitled "METERING DEVICE WITH CONTROL FUNCTIONALITY AND METHOD THEREOF" filed on Jan. 27, 2006; U.S. Design Pat. Application No. 29/224,737 entitled "WALL MOUNT ASSEMBLY" filed on Mar. 7, 2005; U.S. Design Pat. No. D526,920 entitled "ELECTRONIC METER" issued on Aug. 22, 2006; U.S. patent Continuation-in-Part application Ser. No. 11/317,227 entitled "TEST PULSES FOR ENABLING REVENUE TESTABLE PANEL METERS" filed on Dec. 22, 2005; U.S. Pat. No. 6,735,535 entitled "POWER METER HAVING AN AUTO-CALIBRATION FEATURE AND DATA ACQUISITION CAPABILITIES" issued on May 11, 2004; U.S. Pat. No. 6,636,030 entitled "REVENUE GRADE METER WITH HIGH-SPEED TRANSIENT DETECTION" issued on Oct. 21, 2002; U.S. Pat. No. 6,751,563 entitled "ELECTRONIC POWER METER" issued on Jun. 15, 2004; U.S. patent application Ser. No. 10/896,489 entitled "SYSTEM AND METHOD UTILIZING VIRTUAL SWITCHING FOR ELECTRIC PANEL METERING" filed on Jul. 22, 2004; U.S. patent application Ser. No. 10/896,521 entitled "ELECTRICAL METER INSTALLATION SYSTEM AND METHOD" filed on Jul. 22, 2004; U.S. patent application Ser. No. 10/969,713 entitled "TEST PULSES FOR ENABLING REVENUE TESTABLE PANEL METERS" filed on Oct. 20, 2004; U.S. patent application Ser. No. 10/969,592 entitled "SYSTEM AND METHOD FOR PROVIDING COMMUNICATION BETWEEN INTELLIGENT ELECTRONIC DEVICES VIA AN OPEN CHANNEL" filed on Oct. 20, 2004; and U.S. patent application Ser. No. 10/969,706 entitled "ON-LINE WEB ACCESSED ENERGY METER" filed on Oct. 20, 2004, the contents of all of which are hereby incorporated by reference in their entireties.

An intelligent electronic device (IED) 10 for monitoring and determining an amount of electrical power usage by a consumer and for providing broadband Internet access to the consumer is illustrated in FIG. 1. Generally, the IED 10 includes sensors 12, a plurality of analog-to-digital (A/D) converters 14 and a processing system including a central processing unit (CPU) 18 and/or a digital signal processor (DSP) 16. The sensors 12 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 18 or DSP 16.

The CPU 18 is configured for receiving the digital signals from the A/D converters 14 to perform the necessary calculations to determine the power usage and controlling the overall operations of the IED 10. In another embodiment, the DSP 16 will receive the digital signals from the A/D converters 14 and perform the necessary calculations to determine the power usage to free the resources of the CPU 18. It is to be appreciated that in certain embodiments the CPU 18 may perform all the functions performed by the CPU 18 and DSP 16, and therefore, in these embodiments the DSP 16 will not be utilized.

A power supply 20 is also provided for providing power to each component of the IED 10. Preferably, the power supply 20 is a transformer with its primary windings coupled to the incoming power distribution lines and having an appropriate number of windings to provide a nominal voltage, e.g., 5VDC, at its secondary windings. In other embodiments, power is supplied from an independent source to the power supply 20, e.g., from a different electrical circuit, a uninterruptible power supply (UPS), etc. In another embodiment, the power supply 20 can also be a switch mode power supply in which the primary AC signal will be converted to a form of DC signal and then switched at high frequency such as but not limited to 100 Khz and then brought through a transformer which will step the primary voltage down to, for example, 5 Volts AC. A rectifier and a regulating circuit would then be used to regulate the voltage and provide a stable DC low voltage output.

The IED 10 of the present disclosure will include a multimedia user interface 21 for interacting with a user and for communicating events, alarms and instructions to the user. The user interface 21 will include a display for providing visual indications to the user. The display may include a touch screen, a liquid crystal display (LCD), a plurality of LED number segments, individual light bulbs or any combination of these. The display may provide the information to the user in the form of alpha-numeric lines, computer-generated graphics, videos, animations, etc. The user interface 21 will also include a speaker or audible output means for audibly producing instructions, alarms, data, etc. The speaker will be coupled to the CPU 18 via a digital-to-analog converter (D/A) for converting digital audio files stored in a memory 19 to analog signals playable by the speaker. An exemplary interface is disclosed and described in commonly owned co-pending U.S. application Ser. No. 11/589,381, entitled "POWER METER HAVING AUDIBLE AND VISUAL INTERFACE", which claims priority to U.S. Provisional Patent Appl. No. 60/731,006, filed Oct. 28, 2005, the contents of which are hereby incorporated by reference in their entireties.

The IED 10 of the present disclosure will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, jpeg, .jpe, .jfif), MPEG movie files (.mpeg, mpg, .mpe, .m1v, .mp2v .mpeg2), Microsoft Recorded TV Show files (.dvr-ms), Microsoft Windows Video files (.avi) and Microsoft Windows Audio files (.wav).

In addition to storing audio and/or video files, memory 19 will store the sensed and generated data for further processing and for retrieval when call upon to be displayed at the IED 10 or from a remote location. The memory 26 includes internal storage memory, e.g., random access memory (RAM), or removable memory such as magnetic storage memory; optical storage memory, e.g., the various known types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed.

The IED 10 further includes a gateway 22 for deciphering high speed data transmissions imposed on the incoming AC power waveforms. The high speed data will be transmitted as a radio frequency (RF) signal on the power distribution lines but at a different frequency than the incoming electrical power. The gateway 22 will enable symmetric data communications using various protocols, e.g., TCP/IP, POP3, FTP, PPP. Furthermore, the gateway 22 will include a MAC (media access control) device for storing the physical and logical network addresses of the IED 10. In this manner, the power provider or utility will be able to access the CPU 18 and/or an associated memory to retrieve consumer electrical usage without physically traveling to the site where the IED is installed. Utilizing the techniques of the present invention, the utility will be permanently connected to the installed meters. This will allow for additional monitoring of non-consumption based information such as outage reporting and voltage supply reliability issues.

Furthermore, the gateway 22 will enable computing devices coupled to the power lines downstream from the IED, e.g., the electrical power lines in a residence, to have broadband access.

Figure 2:
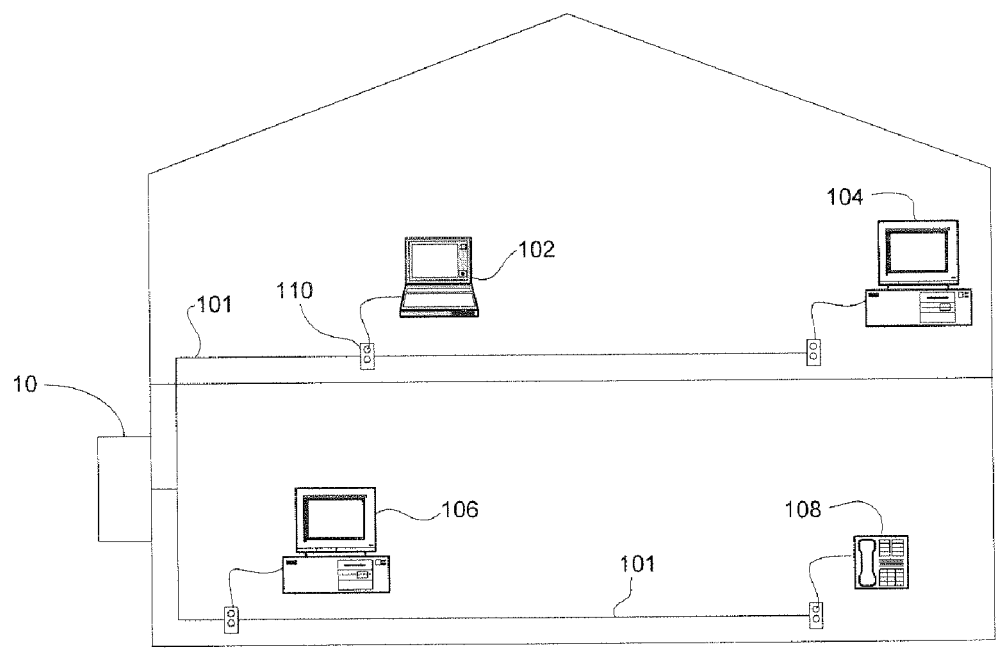
FIG. 2 is a diagram of a system for delivering broadband access to an end user according to an embodiment of the present disclosure.

In one embodiment, the gateway 22 will include a modem and a router. The modem will demodulate data signals from the incoming power lines (i.e., from a utility substation located upstream of the IED location) and the router will impose the data using standard protocols, at a different frequency, onto the downstream power lines 101 as illustrated in FIG. 2. Similarly, the router will receive data signals generated downstream, pass them to the modem and the modem will modulate the data signals onto the power lines. Here, a computing device, e.g., a laptop computer 102, a desktop computer 104, 106, a VoIP-enabled phone 108, etc., will obtain Internet or network access via an adapter 110 plugged into a conventional electrical outlet. The adapter will be coupled to the computing device via a conventional connection such as a USB connection or an Ethernet-based connection.

Figure 4B:
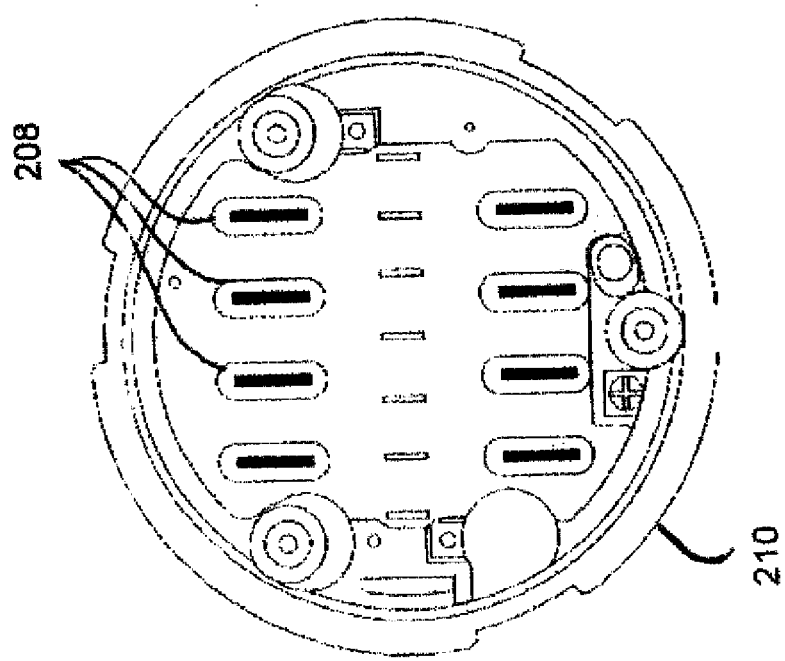
FIG. 4B is a front view of a meter socket for receiving the socket based revenue meter shown in FIG. 4A.
Figure 4A:
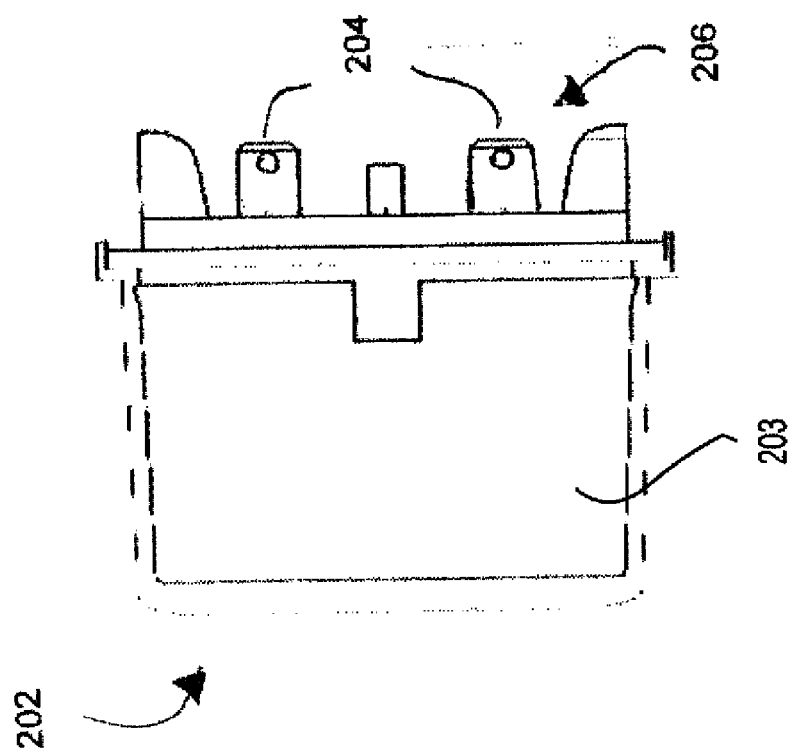
FIG. 4A is a side view of a socket based revenue meter in accordance with an embodiment of the present disclosure.

Preferably, the IED 10 described in FIG. 2 is a socket type revenue meter which is illustrated in more detailed in FIGS. 4A and 4B. The ANSI standards define two general types of revenue meters, socket based ("S-base" or "Type S") and bottom connected ("A-base" or "Type A"). These types of revenue meters are distinguished by the method by which they are connected to the electric circuit that they are monitoring. The socket based meter 202 feature a housing 203 and electrically-conducting bayonets 204 (blade type terminals) disposed on back side 206 of the meter. These electrically-conducting bayonets 204 are designed to align with matching jaws 208 of a detachable meter mounting device such as a revenue meter socket 210. The socket 210 is hard wired to the electrical circuit and is intended to be installed in a permanent manner. To install a socket based meter, the utility need only plug in the meter 202 into the socket 210. This makes installation of new meters and especially replacement of defective meters extremely simple. In accordance with the present disclosure, a residence desiring broadband Internet access would only need to have a socket based meter of the present disclosure plugged into the meter socket, typically disposed on an outside wall of the residence. In this manner, no new infrastructure wires need to be run from the utility, e.g., Internet Service Provider, telephone company, cable provider, etc., to the residence.

In one embodiment, the gateway 22 will use a packet-sharing technology which uses an enhanced form of orthogonal frequency-division multiplexing (OFDM) with forward correction. OFDM is a variation of the frequency-division multiplexing (FDM) used in conventional phone-line networking. FDM puts computer data on separate frequencies from the voice signals being carried by the phone line, separating the extra signal space on a typical phone line into distinct data channels by splitting it into uniform chunks of bandwidth. In the case of OFDM, the available range of frequencies on the electrical subsystem (4.3 MHz to 20.9 MHz) is split into 84 separate carriers. OFDM sends packets of data simultaneously along several of the carrier frequencies, allowing for increased speed and reliability. If noise or a surge in power usage disrupts one of the frequencies, the gateway will sense it and switch that data to another carrier. This rate-adaptive design allows the gateway to maintain an Ethernet-class connection throughout the power-line network without losing any data.

Furthermore, the gateway may operate under other known standards including but not limited to the standards developed by the HomePlug Powerline Alliance, Universal Powerline Association, ETSI, and the IEEE such as IEEE P1675 "Standard for Broadband over Power Line Hardware", IEEE P1775 "Powerline Communication Equipment—Electromagnetic Compatibility (EMC) Requirements—Testing and Measurement Methods", IEEE P1901 "IEEE P1901 Draft Standard for Broadband over Power Line Networks: Medium Access Control and Physical Layer Specifications"; all of which are known in the art and herein incorporated by reference.

Figure 3:
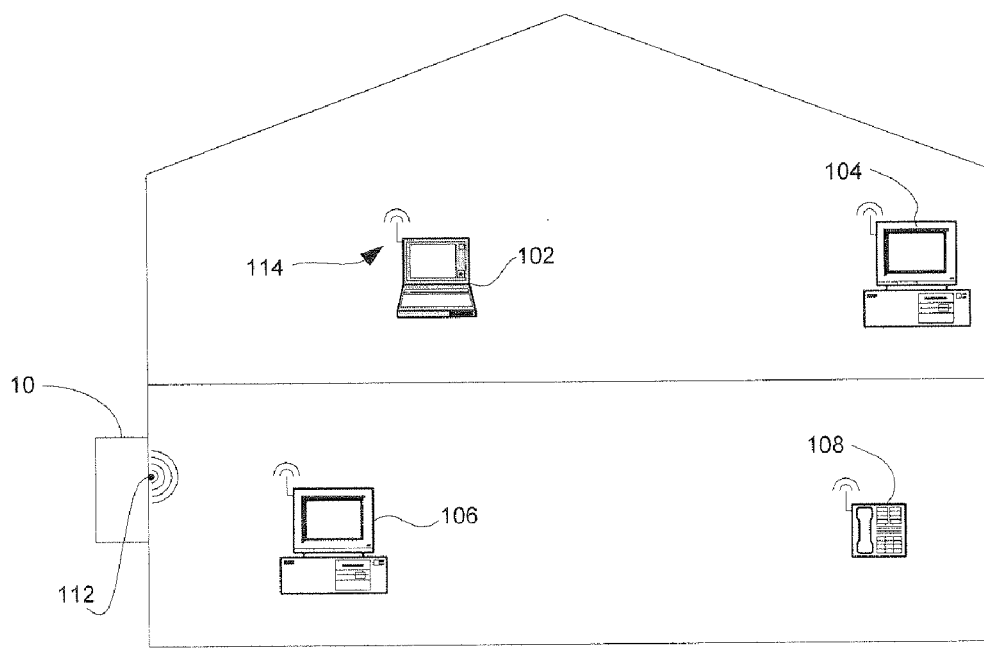
FIG. 3 is a diagram of a system for delivering broadband access to an end user according to another embodiment of the present disclosure.

In a further embodiment, as shown in FIG. 3, the router of the gateway 22 will include an antenna 112 and will communicate to the computing devices via a wireless protocol, for example, WiFi, Bluetooth, or any other known wireless data transmission protocol. In this embodiment, the gateway will act as a wireless access point or router operating, for example, under any of the known or to be developed 802.11 networking standards, also known as WI-FI which currently operate at frequencies of 2.4 GHz to 5 Ghz enabling transmission speed up to at least 54 megabits per second. The gateway 22 will provide for security by employing conventional wireless encryption including but not limited to Wired Equivalency Privacy (WEP), WiFi Protected Access (WPA), Media Access Control (MAC) address filtering, etc. The computing device will have a corresponding wireless transceiver 114, either internal or external, to receive the wireless transmission.

In a further embodiment, the IED 10 will include a switch or relay 24 coupled to the electrical distribution system for interrupting power delivery to a load, e.g., a residential home. The relay 24 is coupled to the CPU 18 which sends a control signal to the relay 24 to open and close the contacts of the relay 24. In this manner, a utility or facility manager may control power delivery to the load, e.g., an end user, by controlling the relay over a network connection, e.g., the Internet. By knowing the network address of the IED 10, the utility or facility manager can send a command to the CPU 18 via gateway 22 to interrupt power delivery to the load.

In an additional embodiment, the IED 10 will also have the capability of not only digitizing the waveform, but storing the waveform and transferring that data upstream to a central computer, e.g., a remote server, when an event occurs such as a voltage surge or sag or a current short circuit. This data will be triggered on an event, stored to memory, e.g., non-volatile RAM, and additionally transferred to a host computer within the existing communication infrastructure. The digitized waveform will also allow the CPU 18 to compensate other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system.

The techniques of the present disclosure can be used to automatically maintain program data and provide field wide updates upon which IED firmware and/or software can be upgraded. An event command can be issued by a user, on a schedule or by digital communication that will trigger the IED to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

While the disclosure has been shown and described with reference to certain preferred embodiments thereof, it will be understood by those skilled in the art that various changes in form and detail may be made therein without departing from the spirit and scope of the disclosure.

What is claimed is:

1. An intelligent electronic device for providing broadband access to a network comprising:

at least one sensor coupled to at least one utility power line of an electrical power distribution system and configured for measuring at least one power parameter of the at least one utility power line and generating at least one analog signal indicative of the at least one power parameter;

at least one analog to digital converter coupled to the at least one sensor, configured for receiving the at least one analog signal and converting the at least one analog signal to at least one digital signal;

at least one processor configured for receiving the at least one digital signal and calculating energy consumption in the electrical circuit; and a gateway coupled to the at least one utility power line of the electrical power distribution system and configured for receiving broadband data transmissions imposed on the at least one utility power line, demodulating the imposed data transmission and routing the demodulated data to a computing device located downstream from the intelligent electronic device.

2. The intelligent electronic device as in claim 1, wherein the gateway further comprises a media access control (MAC) device configured for storing a physical and logical network address.

3. The intelligent electronic device as in claim 1, wherein the gateway further comprises a modem configured for demodulating the imposed data transmission.

4. The intelligent electronic device as in claim 3, wherein the gateway further comprises a router for imposing the demodulated data onto an electrical circuit downstream of the intelligent electronic device.

5. The intelligent electronic device as in claim 4, wherein the imposed data transmission is of a first frequency and the imposed demodulated data is of a second frequency.

6. The intelligent electronic device as in claim 1, wherein the gateway is further configured for broadcasting the demodulated data wirelessly.

7. The intelligent electronic device as in claim 6, wherein the broadcasted data is encrypted.

8. The intelligent electronic device as in claim 1, further comprising a switch coupled to the at least one utility power line configured for interrupting power delivery to a load, wherein the switch is activated by a command signal imposed on the at least one utility power line.

9. The intelligent electronic device as in claim 1, wherein the gateway is further configured to receive power data from the at least one processor and transfer the data upstream to a remote computer.

10. The intelligent electronic device as in claim 1, further comprising an e-mail client configured to receive power data from the at least one processor and e-mail the data upstream to a remote server.

11. A socket based revenue meter for providing broadband access to a network comprising:
 a housing;
 blade connections disposed on the meter mateable with matching jaws of a detachable meter mounting device for connecting the meter to a power line of a power distribution system;
 at least one sensor coupled to at least one blade connection, configured for measuring at least one power parameter of the power line and generating at least one analog signal indicative of the at least one power parameter;
 at least one analog to digital converter coupled to the at least one sensor, configured for receiving the at least one analog signal and converting the at least one analog signal to at least one digital signal;
 at least one processor configured for receiving the at least one digital signal and calculating energy consumption in the electrical circuit; and
 a gateway disposed in the housing coupled to the power line of the electrical power distribution system via at least one blade connection and configured for receiving broadband data transmissions imposed on the power line upstream of the meter, demodulating the imposed data transmissions and broadcasting wirelessly the demodulated data to a computing device located downstream from the meter.

12. The socket based revenue meter as in claim 11, wherein the gateway is configured to broadcast the demodulated data via a Bluetooth protocol.

13. The socket based revenue meter as in claim 11, wherein the gateway is configured to broadcast the demodulated data via a WiFi protocol.

14. The socket based revenue meter as in claim 11, wherein the gateway is configured to broadcast the demodulated data via a 802.11 networking protocol.

15. The socket based revenue meter as in claim 11, wherein the broadcasted data is encrypted.

16. The socket based revenue meter as in claim 15, wherein the gateway encrypts the broadcasted data by Wired Equivalency Privacy (WEP) encryption.

17. The socket based revenue meter as in claim 15, wherein the gateway encrypts the broadcasted data by WiFi Protected Access (WPA) encryption.

18. The socket based revenue meter as in claim 15, wherein the gateway encrypts the broadcasted data by Media Access Control (MAC) address filtering encryption.

19. The socket based revenue meter as in claim 11, further comprising a switch coupled to the power line configured for interrupting power delivery to a load, wherein the switch is activated by a command signal imposed on the power line.

20. The socket based revenue meter as in claim 11, further comprising an e-mail client configured to receive power data from the at least one processor and e-mail the data upstream to a remote server.

21. An system for providing broadband Internet access comprising:
 at least one intelligent electronic device comprising:
 at least one sensor coupled to at least one utility power line of an electrical power distribution system and configured for measuring at least one power parameter of the at least one utility power line and generating at least one analog signal indicative of the at least one power parameter;
 at least one analog to digital converter coupled to the at least one sensor, configured for receiving the at least one analog signal and converting the at least one analog signal to at least one digital signal;
 at least one processor configured for receiving the at least one digital signal and calculating energy consumption in the at least one utility power line; and
 a gateway coupled to the at least one utility power line of the electrical power distribution system and configured for receiving broadband data transmissions imposed on the at least one utility power line, demodulating the imposed data transmission and routing the demodulated data to a computing device located downstream from the intelligent electronic device; and
 at least one adapter coupled to the downstream portion of the at least one utility power line configured for providing the demodulated data to at least one network device.

22. The system as in claim 21, wherein the network device is a computer.

23. The system as in claim 21, wherein the network device is a VoIP-enabled phone.

24. The system as in claim 21, wherein the gateway is further configured for broadcasting the demodulated data wirelessly.

25. The system as in claim 24, wherein the at least one adapter comprises a wireless transceiver configured for receiving the demodulated data wirelessly and for providing the demodulated data to the at least one network device.

26. The system as in claim 25, wherein the network device is a computer.

27. The system as in claim 25, wherein the network device is a VoIP-enabled phone.

28. The system as in claim 21, wherein the gateway is configured for routing the demodulated data via a power line carrier protocol.

29. An intelligent electronic device coupled to at least one utility power line of an electrical power distribution system and configured for measuring at least one power parameter of the at least one utility power line, the intelligent electronic device comprising:
a gateway coupled to the at least one utility power line of the electrical power distribution system and configured for receiving broadband data transmissions imposed on the at least one utility power line, demodulating the imposed data transmission and routing the demodulated data to a computing device located downstream from the intelligent electronic device.

30. The intelligent electronic device as in claim 29, wherein the gateway further comprises a media access control (MAC) device configured for storing a physical and logical network address.

31. The intelligent electronic device as in claim 29, wherein the gateway further comprises a modem configured for demodulating the imposed data transmission.

32. The intelligent electronic device as in claim 29, wherein the gateway further comprises a router for imposing the demodulated data onto an electrical circuit downstream of the intelligent electronic device.

33. The intelligent electronic device as in claim 32, wherein the imposed data transmission is of a first frequency and the imposed demodulated data is of a second frequency.

34. The intelligent electronic device as in claim 29, wherein the gateway is further configured for broadcasting the demodulated data wirelessly.

35. The intelligent electronic device as in claim 29, further comprising a wireless access point configured for receiving the demodulated data from the gateway and broadcasting the demodulated data wirelessly.

36. The intelligent electronic device as in claim 29, wherein the gateway routes the demodulated data wirelessly.

37. The intelligent electronic device as in claim 36, wherein the gateway is configured to route the demodulated data via a Bluetooth protocol.

38. The intelligent electronic device as in claim 36, wherein the gateway is configured to route the demodulated data via a WiFi protocol.

39. The intelligent electronic device as in claim 36, wherein the gateway is configured to route the demodulated data via a 802.11 networking protocol.

40. The intelligent electronic device as in claim 36, wherein the routed data is encrypted.

41. The intelligent electronic device as in claim 40, wherein the gateway encrypts the routed data by Wired Equivalency Privacy (WEP) encryption.

42. The intelligent electronic device as in claim 40, wherein the gateway encrypts the routed data by WiFi Protected Access (WPA) encryption.

43. The intelligent electronic device as in claim 40, wherein the gateway encrypts the routed data by Media Access Control (MAC) address filtering encryption.

* * * * *